United States Patent
Naviasky et al.

(10) Patent No.: US 7,126,435 B2
(45) Date of Patent: Oct. 24, 2006

(54) VOLTAGE CONTROLLED OSCILLATOR AMPLITUDE CONTROL CIRCUIT

(75) Inventors: Eric H. Naviasky, Ellicott City, MD (US); Michael A. Casas, Pasadena, MD (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/948,087

(22) Filed: Sep. 22, 2004

(65) Prior Publication Data

US 2005/0104670 A1 May 19, 2005

Related U.S. Application Data

(60) Provisional application No. 60/505,468, filed on Sep. 23, 2003.

(51) Int. Cl.
*H03L 5/00* (2006.01)
(52) U.S. Cl. .................... 331/182; 331/117 FE; 331/183; 331/175; 331/74; 331/117 R; 331/167
(58) Field of Classification Search ........... 331/167, 331/183, 175, 117 FE, 182, 117 R, 74
See application file for complete search history.

(56) References Cited

U.S. PATENT DOCUMENTS

| | | |
|---|---|---|
| 4,373,181 A | 2/1983 | Chisholm et al. |
| 4,684,831 A | 8/1987 | Krues |
| 4,787,082 A | 11/1988 | Delaney et al. |
| 4,797,635 A | 1/1989 | Hatcher |
| 5,382,921 A | 1/1995 | Estrada et al. |
| 5,448,598 A | 9/1995 | Yousefi et al. |
| 5,485,113 A | 1/1996 | Ito et al. |
| 5,485,490 A | 1/1996 | Leung et al. |
| 5,533,072 A | 7/1996 | Georgiou et al. |
| 5,548,280 A | 8/1996 | Pearce |
| 5,550,860 A | 8/1996 | Georgiou et al. |
| 5,578,939 A | 11/1996 | Beers et al. |
| 5,587,675 A | 12/1996 | Schmitt |
| 5,592,629 A | 1/1997 | Gamble |
| 5,598,443 A | 1/1997 | Poeppleman |
| 5,623,518 A | 4/1997 | Pfiffner |
| 5,633,899 A | 5/1997 | Fiedler et al. |
| 5,638,028 A | 6/1997 | Voth |
| 5,818,304 A | 10/1998 | Hogeboom |
| 5,844,436 A | 12/1998 | Altmann |
| 6,002,279 A | 12/1999 | Evans et al. |
| 6,137,375 A | 10/2000 | Li |

(Continued)

FOREIGN PATENT DOCUMENTS

EP 0 285 413 A2 5/1988

OTHER PUBLICATIONS

Alexander, J. D. H., " *Clock Recovery from Random Binary Signals, Electronic Letters*", Oct. 30, 1975, pp. 541-542, vol. 11, No. 22, The Institue of Elecrtrical Engineers, U.K.

(Continued)

*Primary Examiner*—Arnold Kinkead
(74) *Attorney, Agent, or Firm*—Bingham McCutchen LLP

(57) ABSTRACT

A voltage controlled oscillator amplitude control circuit has a voltage controlled oscillator circuit to output an oscillating signal having a controlled amplitude. It also has a control circuit to control the amplitude of the oscillating signal by providing a dominant pole, a filtering function, rectification, and a gain at a single node of the circuit.

22 Claims, 3 Drawing Sheets

U.S. PATENT DOCUMENTS 6,812,802 B1 * 11/2004 Godambe et al. ........... 331/183

OTHER PUBLICATIONS

American National Standard for Information Systems, "*Fibre Channel—Physical and Signaling Interface (FC-PH) Rev 4.3*", proposed working draft, Jun. 1, 1994, USA.

Applied Micro Circuits Corporation, "*Preliminary Device Specification for Fibre Channel Gigabit Ethernet Transceivers S2053 and S2054*", Feb. 3, 1998.

Applied Micro Circuits Corporation, "*Fibre Channel Products*", 1996.

CERN Fibre Channel homepage, available in 1999 at http://www.cern.ch/HSI/fcs/fcs.html.

Fibre Channel Association, "*Welcome to the FCA Server*", May 23, 1997.

Jurgens, C., "*Fibre Channel: A Connection to the Future*", Computer, vol. 28, No. 8, Aug. 1995.

"*Fiber Channel Components*", Electronic Components, Hewlett Packard, 1995.

Gore CuGLM™, "*Copper Gigabaud Link*", Module FCN 7181, Aug. 1997.

Margarit, M. A. et al., "*A Low-Noise, Low-Power VCO with Automatic Amplitude Control for Wireless Applications*", IEEE Journal of Solid-State Circuits, Jun. 1999, pp. 761-771, vol. 34, No. 6.

Meggyesi, Z., "*Fibre Channel Overview*", available in 1999 at http://www1.cern.ch/HSI/fcs/spec/overview.htm.

Nelson, C., "*Fiber Channel Offers Speed, Interoperability*", EE Times—Communications Design, CMP Media Inc., available in 1999, at http://techweb.cmp.com/eet/nick/comdesign.fibercha.html.

Partovi, H., et al., "*A 62.5 Gb/s Multi-Standard SerDes IC*", Proceedings of the IEEE 2003 Custom Integrated Circuits Conference, Sep. 21-24, 2003, pp.: 585-588, USA.

"*SFI-4 (OC-192 Serdes Framer Interface) OiF-PLL-02.0—Proposal for a Common Electrical Interface Between SONET Framer and Serializer/Deserializer Parts for OC-192 Interfaces*", Optical Internetworking Forum, OIF-SF 14-01.0 Implementation Agreement, Sep. 26, 2000.

Shafire, H., "*Gigibit Networking Technologies Converge*", Part 4, Communications Design, CMP Media, Inc., available in 1999 from http://techweb.cmp.com/ee/nick/comdesign/gigabitn.html.

Unisys Corporation, "*Fibre Channel White Paper*", 1996.

Vitesse Semiconductor Corporation, "*Advance Product Information (Draft)*", Oct. 19, 1995, pp. 1-13, USA.

VLSI Technology, Inc. "*Fibre Channel ENDEC+*", Product Bulletin, Aug. 1995, USA.

Webstart Communications, "*Computer and Communication Standards and Cross References*", available in 1999 at http://www.cmpcmm.com/cc/standards.html.

\* cited by examiner

VOLTAGE CONTROLLED OSCILLATOR AMPLITUDE CONTROL CIRCUIT

CROSS REFERENCE TO RELATED APPLICATION

This application claims the benefit of U.S. provisional application No. 60/505,468 filed Sep. 23, 2003, which is incorporated herein by reference in its entirety.

FIELD OF THE INVENTION

This invention is related to the field of electronic circuit design.

BACKGROUND

Very accurate or spectrally pure signals are needed in many applications in modern integrated circuit design. The spectral purity and the timing accuracy are just two ways of looking at the same characteristic of the signal. Spectral purity is a frequency domain measurement and jitter is a time domain measurement, however, these terms are often used interchangeably. One way to produce a low jitter signal on chip is to use an on chip LC (inductor-capacitor) tank oscillator.

The basic oscillator consists of a LC tank that sets the operating frequency of the signal, and an amplifier to make up for signal losses in the LC tank and to drive the signal to-the next stage. The frequency and the phase of the oscillator are maintained with a Phase Locked Loop (PLL), where the phase and frequency of the signal output by the oscillator is compared to an external reference signal. Adjustments to drifts in phase or frequency of the oscillator may be made by the PLL through a voltage control pin. This structure is known as a Voltage Controlled Oscillator (VCO).

Desirable characteristics of the VCO are often wide frequency tuning range, low power dissipation, low phase noise or jitter, low sensitivity to the power supply voltage, stable output voltage, low harmonic content, small physical size, and a relatively simple design.

The frequency of the oscillator may be tuned with a device such as a voltage variable capacitor (varactor), that may be included as part of the capacitance of the tank. The oscillation is started by noise in the amplifier, or the LC tank being amplified by the amplifier, and filtered by the tank to cause an exponentially growing sinusoidal oscillation at the tank frequency.

Oscillation occurs when the amplifier characteristics (gain in units of transconductance–$I_{out}/V_{in}$), in consort with the tank impedance, produce a gain greater than unity. The amplitude of the oscillation is limited either by the amplifier running out of voltage swing room or current drive to the tank. In the interest of maintaining the lowest harmonic content, the least sensitivity to the power supply voltage, and the lowest possible power dissipation practical with on-chip inductor values, the amplitude is usually limited by the available drive current of the amplifier. It can be shown that the equivalent impedance of the tank varies with the square of the frequency. For a given drive current, the amplitude of the steady state sine wave varies with the square of the tuning range. In addition, the effective gain of the loop varies with the square of the tuning range. For wide tuning range VCOs, this causes numerous problems.

For example, if the gain (transconductance) of the amplifier is set high enough to ensure that the oscillation will build up at the lowest frequency, the power dissipation at higher frequencies is higher than desired. Also, the amplitude to frequency conversion process converts amplitude noise either from thermal sources or supply induced to phase noise and jitter.

In addition, the sensitivity of the frequency to the control voltage ($K_{vco}$) varies. The range of the variation of capacitance of the varactor is fixed by the design of the device. The range of control voltage that the capacitance variation occurs over is a function of the voltage swing of the sinusoid. This occurs because the varactor is a two terminal device referenced to the tank voltage. The voltage on the varactor is the difference between the control voltage and the instantaneous value of the tank voltage. It's effect on the frequency is the product of highly nonlinear control function of the varactor and the signal integrated over a cycle of the oscillation. Thus a larger swing of the sinusoid causes a smaller $K_{vco}$. This conventional design for the control device greatly complicates the design of the PLL due to its impact on the stability of the loop.

DETAILED DESCRIPTION

In one embodiment, an amplitude control loop circuit compares the amplitude of the oscillator sinusoid to a reference signal, and controls the drive current (and/or gain) based on the comparison, which stabilizes the amplitude of the oscillation. The control loop is relatively small, uses a low amount of power, and is easy to implement in integrated circuit applications.

Further details of aspects, objects, and advantages of the invention are described in the description, drawings, and claims.

Figure 1A:
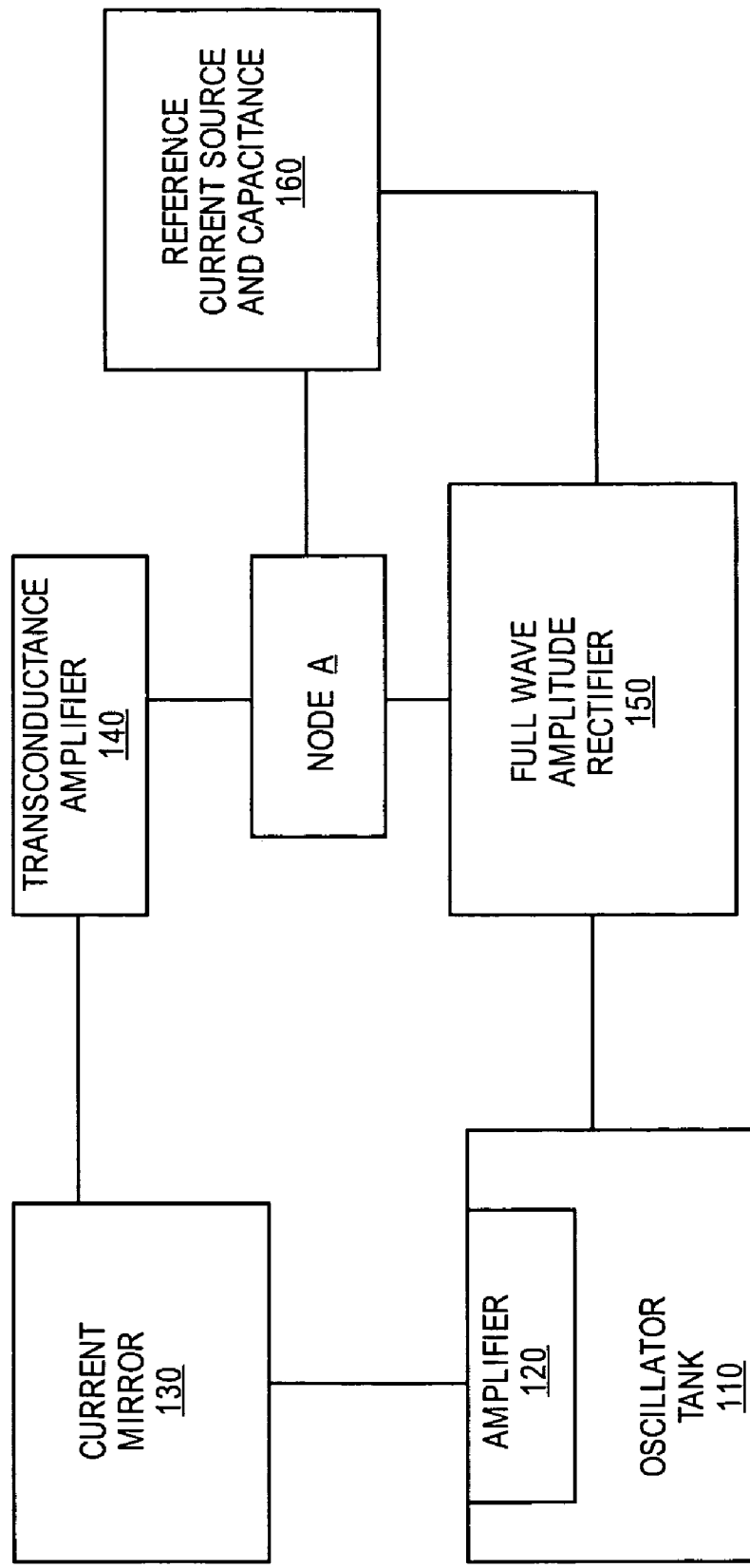
FIG. 1A is an example systems drawing of a voltage controlled oscillator amplitude control circuit.

In one example, amplitude control loop circuit as shown in FIG. 1A controls the amplitude of a Voltage Controlled Oscillator (VCO) using a control circuit that provides a dominant pole, a filtering function, rectification, and a gain at a single node of the circuit. Rectifier 150 output is integrated at node A to provide a dominate pole for the circuit. The circuit regulates the current of the amplifier 120 in oscillator tank 110 based on a comparison of an output of a full wave rectifier 150 to a fixed reference 160 at the single node A. The comparison can produce a sum or a difference of the two currents, which creates a voltage signal at node A.

For example, if the amplitude of the signal that is output of the VCO is lower than desired, then the voltage level at node A rises, because the reference current signal 160 is larger than the representative oscillator current signal. If the amplitude of the oscillating signal is too high, then the voltage at node A is pulled down, because the current signal that is output of the rectifier 150 is greater than the reference current signal. If the amplitude of the oscillating signal is correct, then the voltage at node A is balanced by the reference current signal 160 and the current signal that is output from the rectifier 150, which are equal. This voltage from the dominant pole node is input to a transconductance amplifier 140, which converts the voltage signal to a control current signal. This control signal is received by a current source 130, which adjusts the current signal that it sends to the VCO based on the control current signal.

Figure 1B:
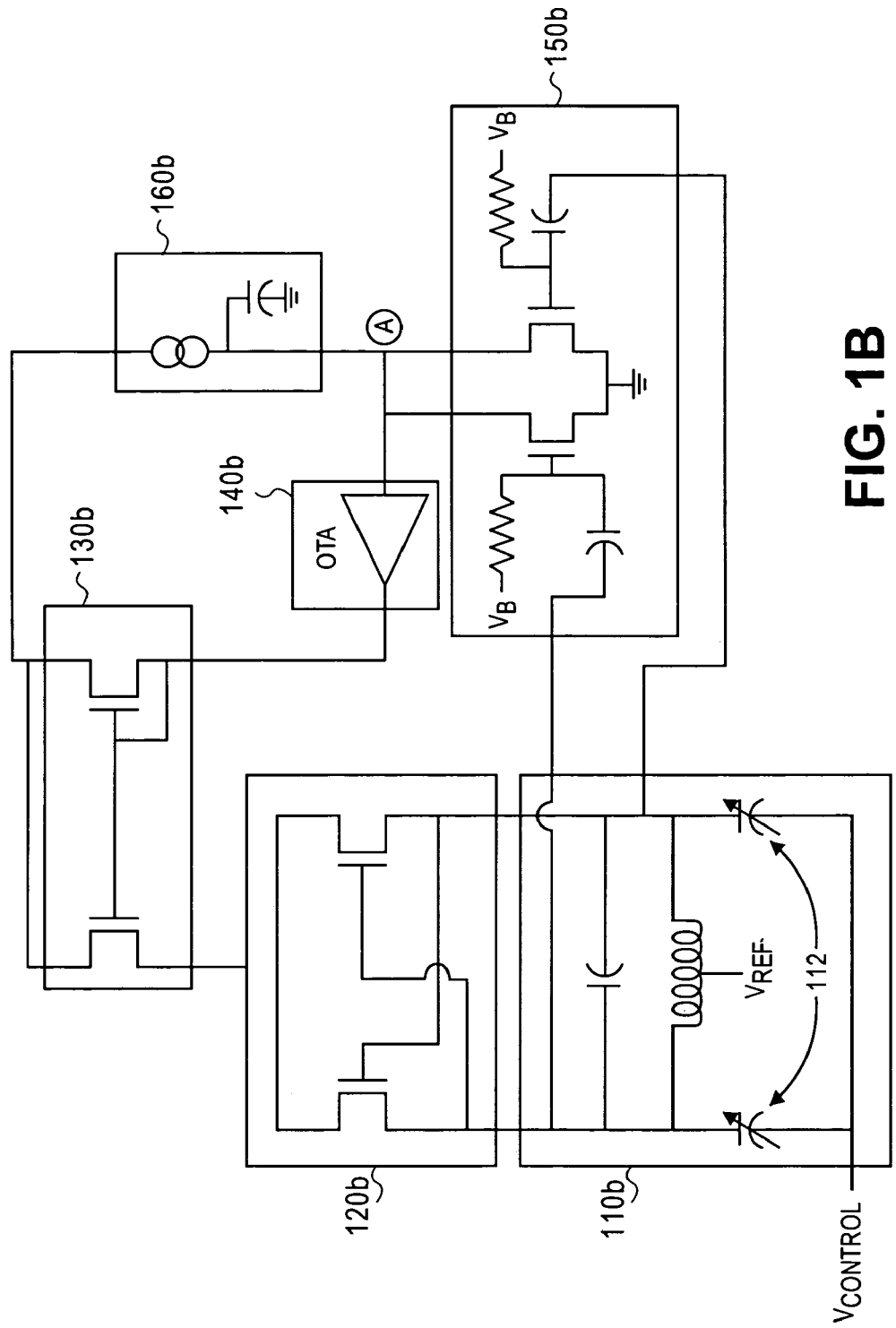
FIG. 1B shows an example embodiment of a voltage controlled oscillator amplitude control circuit.

A diagram of the control circuit is shown in FIG. 1B. The oscillator LC tank 110b includes tuning varactors 112. The amplifier 120b makes up for the losses in the LC tank and drives the next stage. The current mirror 130b supplies the operating current for the amplifier. The transconductance amplifier 140b converts the amplitude control voltage on node A to a current to control the oscillator amplifier 120b. The full wave amplitude rectifier or detector 150b monitors the oscillation amplitude and compares it to a reference implicitly set by the bias voltage Vb. Current source and capacitance, i.e. integrator, 160b perform an integration to provide at least a portion of the loop gain, to make the loop the dominant pole, which increases loop stability and accuracy.

Figure 2:
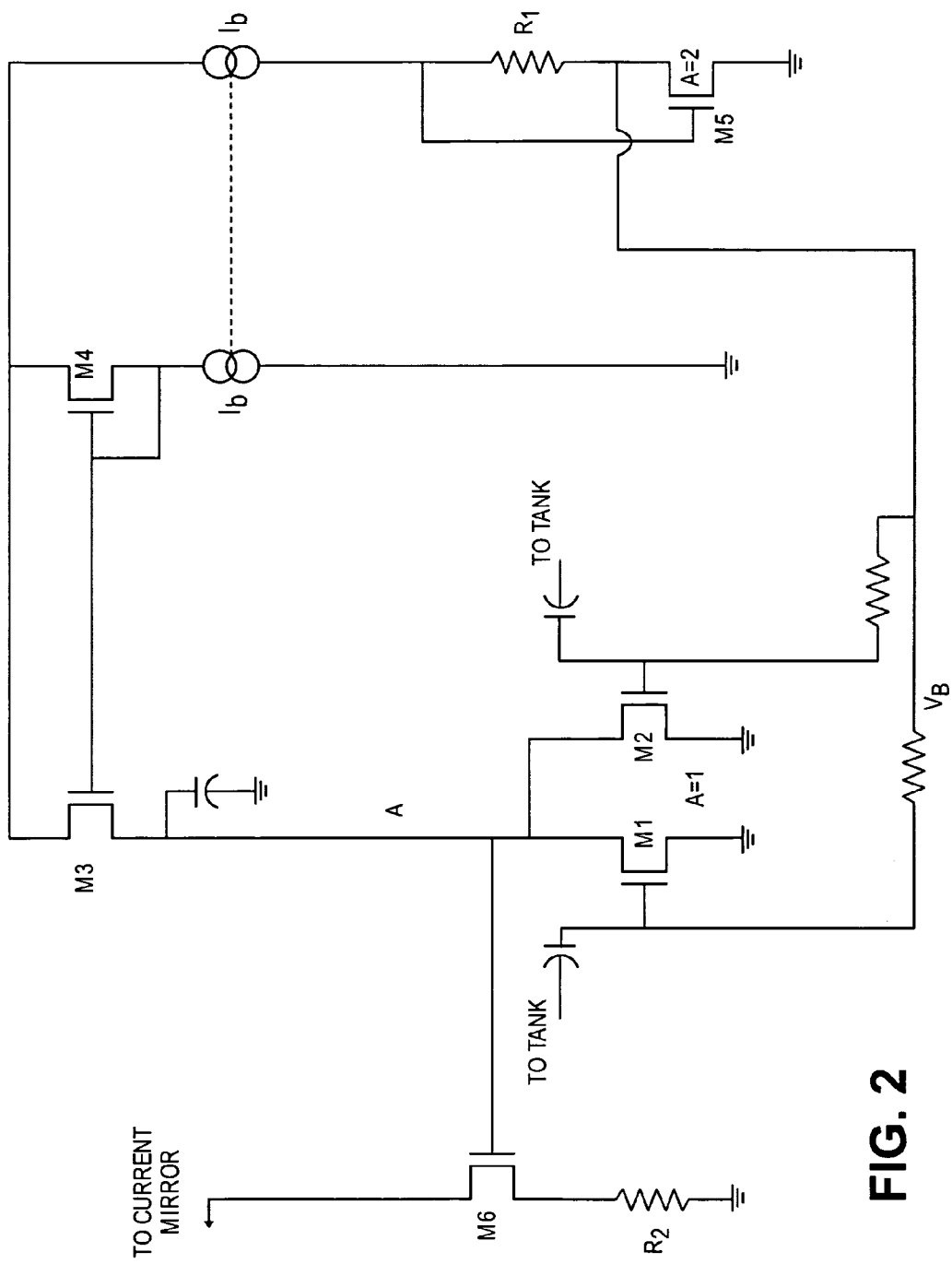
FIG. 2 shows an example of the details of portions of the circuit.

Referring to FIG. 2, the oscillation signal is coupled from both sides of the LC tank through alternating current (AC) coupling capacitors to the gates of two MOSFET transistors (M1,M2). Transistor M5 forms a current mirror with M1 and M2. The gate of M5 is at a level that causes M5 to conduct $I_b$ drain current. If this voltage were applied to M1 and M2, the sum of their drain currents would also be $I_b$. Resistor R1 serves to drop the voltage applied to the gate by $I_bR1$ volts, which reduces the current that flows through transistors M1 and M2. An example of a value for $I_bR1$ is 150 milli Volts (mV).

Since the current that current mirror M3, M4 is trying to source to node A is $I_b$, in the absence of a radio frequency (RF) signal on the gates of M1 and M2, the node A is pulled high. As the RF signal applied to the gates of M1 and M2 increases, the increase in the current of the transistor that is experiencing an increasing gate voltage is greater than the decrease in the current in the transistor that is experiencing a decreasing gate voltage. This is a result of the nonlinear relationship between drain current and gate voltage in a MOSFET. The nonlinearity is an exponential relationship in the region below threshold and becomes square law in the region just above threshold. This circuit may traverse both regions.

When the sum of the average current in M1 and M2 is equal to $I_b$, the node A is balanced in the middle. The gain of this circuit may be quite high due to the high output impedance of M3 and M1, M2. Examples of gain numbers for low currents range can from 30 to 60 decibels (dB) for this stage. This gain may be the majority of the loop gain for the system. The circuit may provide a highest gain when biased at low currents, and a least loading when the transistors are small. This helps to ensure that the impact of the level control circuit is negligible on the power and area budgets.

The voltage on node A drives the transconductance amplifier, including transistors M6 and R2. The sizing of M6 and R2 may be used to determine a maximum current that will be delivered to the mirror and therefore to the oscillator. The mirror may have a nominal current gain which can provide a little additional loop gain and may save some power. The current mirror gain can be, for example, 15 to 1. The current mirror can set the maximum current in worst case conditions, such as low inductance, high temperature, and/or minimum frequency.

The amplitude control loop compares the amplitude of the oscillator sinusoid to a reference, and controls the drive current (and gain), at a single node of the circuit, to stabilize the amplitude of the oscillation. For example, the circuit can regulate the current of the amplifier based on a comparison, at the single node, of a current that is output of a full wave rectifier to a fixed reference current. Furthermore, the rectifier output current can be integrated at the single node to provide a dominate pole at the single node for the stabilization system.

The dominant pole can be set by the capacitor on node A. Node A can be a very high impedance node, so the capacitor can be small. The capacitor may be a grounded capacitor with an applied voltage on it of more than a threshold (a result of the input stage of the transconductance amplifier design). Thus, a MOS inversion cap (N-channel MOSFET with the source, drain and substrate grounded) can be used to save considerable area over a regular capacitor. The non-dominant poles are the mirror pole and the effective low frequency pole set by the Q of the tank. Because a high Q tank may not change its amplitude quickly, and the loop is measuring the amplitude for its feedback, a pole is realized that is on the order of f/Q. For practical implementation on chip LC tanks, this is in the range of hundreds of Megahertz, and may not be a concern.

This design to control the VCO amplitude provides a system which is more stable than open loop methods. For example, unlike the open loop methods, which increase the operating current of the oscillator amplifier as more capacitors are switched in to keep the amplitude from dropping too much, providing a circuit to control the amplitude of the VCO reduces the effects of process variations and therefore can be much more stable.

The VCO amplitude control design also uses less power than a design which uses dual emitter followers as rectifiers, and, unlike the design which uses dual emitter followers, the design which uses the amplitude control circuit does not need a separate control loop amplifier.

The VCO amplitude control design can combine a ripple filter for the rectifier with a loop filter. Therefore, this approach has the advantage of a single filter for the rectifier and for the loop. This prevents a potential second pole in the transfer function, and therefore increases the stability of the control loop.

The VCO amplitude control circuit allows for a wider tuning range for the VCO. The control circuit can lower an amount of phase noise by reducing the conversion of amplitude noise to phase noise. The circuit also provides:

linear operation of the oscillator amplifier, a fixed sensitivity of the frequency to the control voltage ($K_{vco}$), a lower harmonic content of the VCO output, a reduced power dissipation, and a reduced power supply sensitivity. In addition, this circuit adds relatively negligible area to the oscillator, and can be designed and implemented easily. The amplitude control loop circuit may be implemented in an integrated circuit (IC) in deep sub-micron CMOS processes, or can be used in other CMOS or BiCMOS processes or in other technologies.

In one embodiment, the voltage controlled oscillator with the amplitude control circuit can be part of a phase locked loop that is used to generate transmit and receive clocks in a serializer-deserializer (SerDes). By using the AC coupled swing control circuit of FIG. 1B in the SerDes IC device, phase noise considerations, proper biasing of the MOS varactors, and variations in the LC tank Q are satisfied by the control that this circuit provides over the swing of the VCO output signal. Thus, with this design, the chip can perform multiplexer and demultiplexer functions for communication protocols with and without de-skew capability from the transmit and receive clocks that are derived from the PLL. Other example embodiments include: RF communications and consumer video applications.

In the foregoing specification, the invention has been described with reference to specific embodiments thereof. It will, however, be evident that various modifications, substitutions of components, and changes may be made thereto without departing from the broader spirit and scope of the invention. The specification and drawings are, accordingly, to be regarded in an illustrative rather than restrictive sense.

The invention claimed is:

1. An apparatus, comprising:
a voltage controlled oscillator (VCO) circuit to output an oscillating signal having an amplitude; and
a control circuit to control the amplitude of the oscillating signal, the control circuit capable of providing a dominant pole, a filtering function, rectification, and a gain at a high impedance single node; and
wherein an area of the control circuit is less than an area of the VCO circuit.

2. An apparatus, comprising:
a voltage controlled oscillator (VCO) circuit including an on chip LC (inductor-capacitor) tank circuit and an amplifier to output an oscillating signal having an amplitude; and
a control circuit to control the amplitude of the oscillating signal, the control circuit capable of providing a dominant pole, a filtering function, rectification, and the amplifier gain at a high impedance single node; and
wherein the VCO circuit and the control circuit each comprises a part of a phase locked loop circuit that is used to generate transmit and receive clocks in a SerDes integrated circuit (IC) device.

3. The apparatus of claims 1 or 2, wherein the control circuit comprises dual grounded source transistors that convert the amplitude of the oscillating signal into a rectified current signal, and output the rectified current signal to the high impedance single node.

4. The apparatus of claim 3, wherein the control circuit comprises a filter that filters the rectified current signal at the high impedance single node.

5. The apparatus of claim 3, wherein the control circuit comprises a reference current source that outputs a reference current signal to the high impedance single node.

6. The apparatus of claim 5, wherein the rectified current signal from the dual grounded source transistors and the reference current source are summed at the high impedance single node to provide the gain at the high impedance single node.

7. The apparatus of claims 1 or 2, wherein the VCO circuit and the control circuit are implemented in an integrated circuit (IC).

8. The apparatus of claim 7, wherein the implementation is performed using a process selected from the group consisting of a sub-micron fabrication process, a BiCMOS process, and a CMOS process.

9. The apparatus of claim 8, wherein the control circuit to control the amplitude of the oscillating signal of the VCO reduces the effects of process variations in the IC.

10. The apparatus of claims 1 or 2, wherein the control circuit comprises a combined filter for the rectified current signal and a loop filter at the high impedance single node.

11. The apparatus of claim 10, wherein the combined filter prevents a second pole in a transfer function of the control circuit, and increases a stabilization of the control circuit.

12. The apparatus of claims 1 or 2, wherein the amplitude control circuit increases a tuning range of the VCO circuit.

13. The apparatus of claims 1 or 2, wherein the control circuit reduces phase noise by reducing a conversion of amplitude noise to phase noise.

14. The apparatus of claims 1 or 2, wherein the control circuit can linearly operate the amplifier of the VCO circuit.

15. The apparatus of claims 1 or 2, wherein the control circuit provides a fixed sensitivity of the oscillating signal frequency to the control voltage.

16. The apparatus of claims 1 or 2, wherein the control circuit can lower a harmonic content of the output of the VCO circuit.

17. The apparatus of claims 1 or 2, wherein the control circuit can reduce power dissipation of the VCO circuit.

18. The apparatus of claims 1 or 2, wherein the control circuit can reduce power supply sensitivity of the VCO circuit.

19. The apparatus of claim 14, wherein the amplifier gain regulate the current of the amplifier based on at least one of the rectified current signal and the reference current.

20. The apparatus of claims 1 or 2, wherein the filtering function comprises an N-channel MOSFET inversion cap that is used to set the dominant pole at the high impedance single node.

21. The apparatus of claims 20, wherein the rectified current signal is integrated by the N-channel MOSFET inversion cap that is used to set the dominant pole on the high impedance single node.

22. The apparatus of claim 1 in which the voltage controlled oscillator circuit comprises an on chip LC tank circuit and an amplifier and wherein the area of the control circuit is less than an area of the on chip LC tank oscillator circuit.

* * * * *